United States Patent [19]
Valentian

[11] Patent Number: 5,549,473
[45] Date of Patent: Aug. 27, 1996

[54] LOADER DEVICE FOR AN AUTOMATIC SPACE FURNACE

[75] Inventor: Dominique Valentian, Rosny, France

[73] Assignee: Societe Europeenne de Propulsion, Suresmes, France

[21] Appl. No.: 437,976

[22] Filed: May 10, 1995

[30] Foreign Application Priority Data

May 13, 1994 [FR] France ................... 94 05892

[51] Int. Cl.⁶ ...................................... B27D 3/00
[52] U.S. Cl. .................. 432/239; 432/5; 432/9; 432/10; 432/14; 432/121; 432/242; 414/172; 414/331
[58] Field of Search ............ 432/5, 9, 10, 14, 432/121, 239, 242; 414/150, 172, 222, 331

[56] References Cited

PUBLICATIONS

"Floating Zone Growth of Silicon Under Microgravity in a Sounding Rocket", A. Eyer, et al., Journal of Crystal Growth, vol. 71, No. 1, Jan. 1, 1995, Amsterdam, pp. 173–175.

"The Materials–Science Element of the First Space Lab Payload", U. Huth, ESA Bulletin, No. 31, Aug. 1, 1982, pp. 34–45.

*Primary Examiner*—Henry Bennett
*Assistant Examiner*—Siddharth Ouri
*Attorney, Agent, or Firm*—Weingarten, Schurgin, Gagnebin & Hayes

[57] ABSTRACT

The loader device comprises a cartridge-carrying carousel provided with a set of cartridge-holders in which sealed closed cartridges are mounted in removable manner, each cartridge being designed to contain a sample for processing in a space furnace, the device further comprising a control mechanism for imparting indexed rotary drive to the cartridge-holders. The carousel is mounted to one side of the furnace in such a manner that its axis of rotation is parallel to longitudinal axis of the furnace. Each cartridge-holder of the carousel co-operates with a transfer mechanism that includes a translation arm extending perpendicularly to the axis of rotation of the carousel to enable each cartridge to be brought successively into a working position in which the axis of the cartridge is in alignment with the longitudinal axis of the furnace. The control mechanism for imparting rotary drive to the cartridge-holders and the transfer mechanism are activated alternately by a single electric motor.

17 Claims, 13 Drawing Sheets

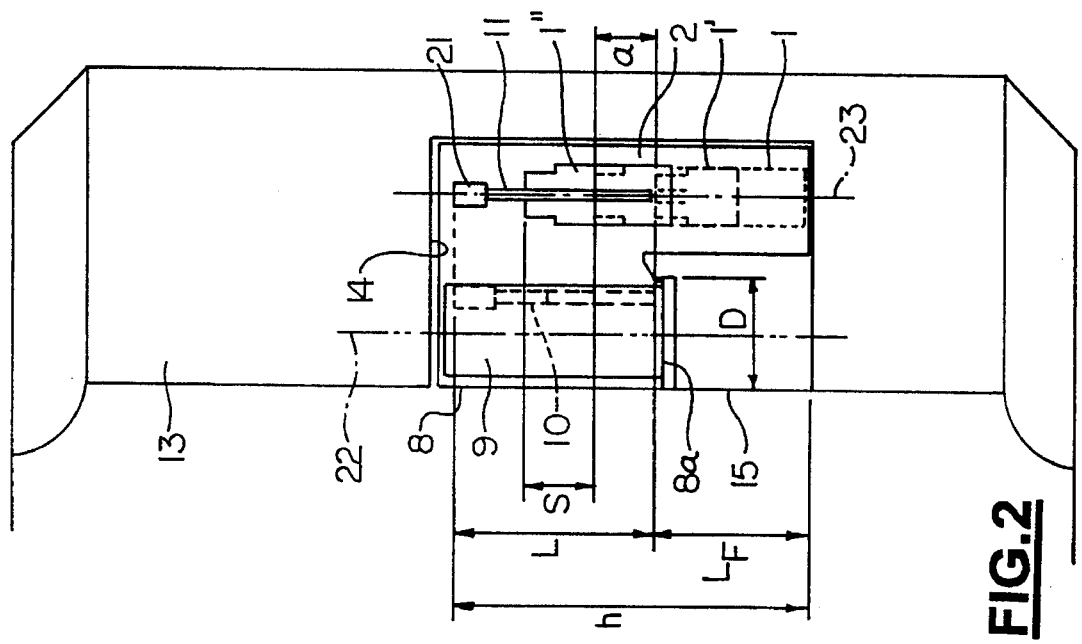
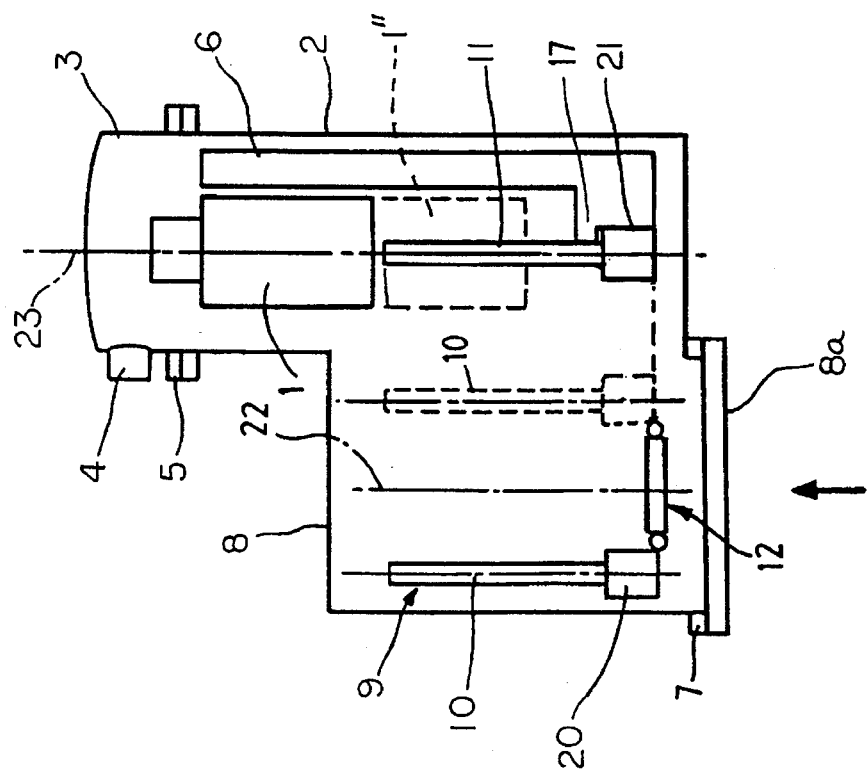
FIG.1
FIG.2

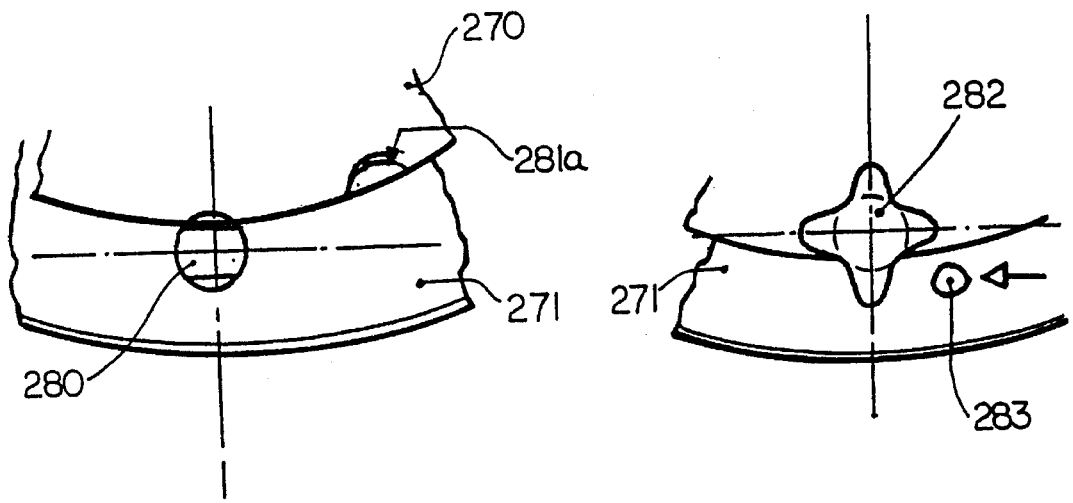
FIG.10 A
FIG.10 B
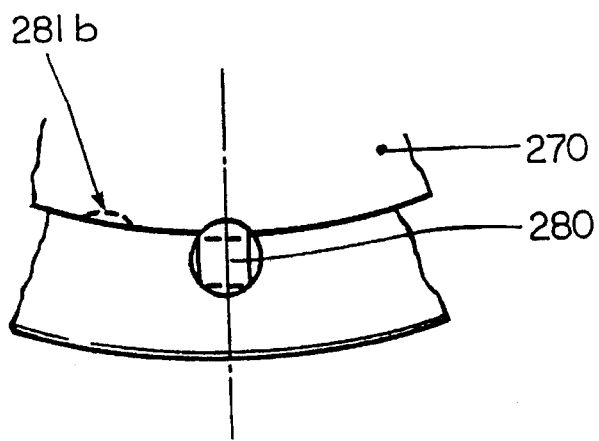
FIG.10 C

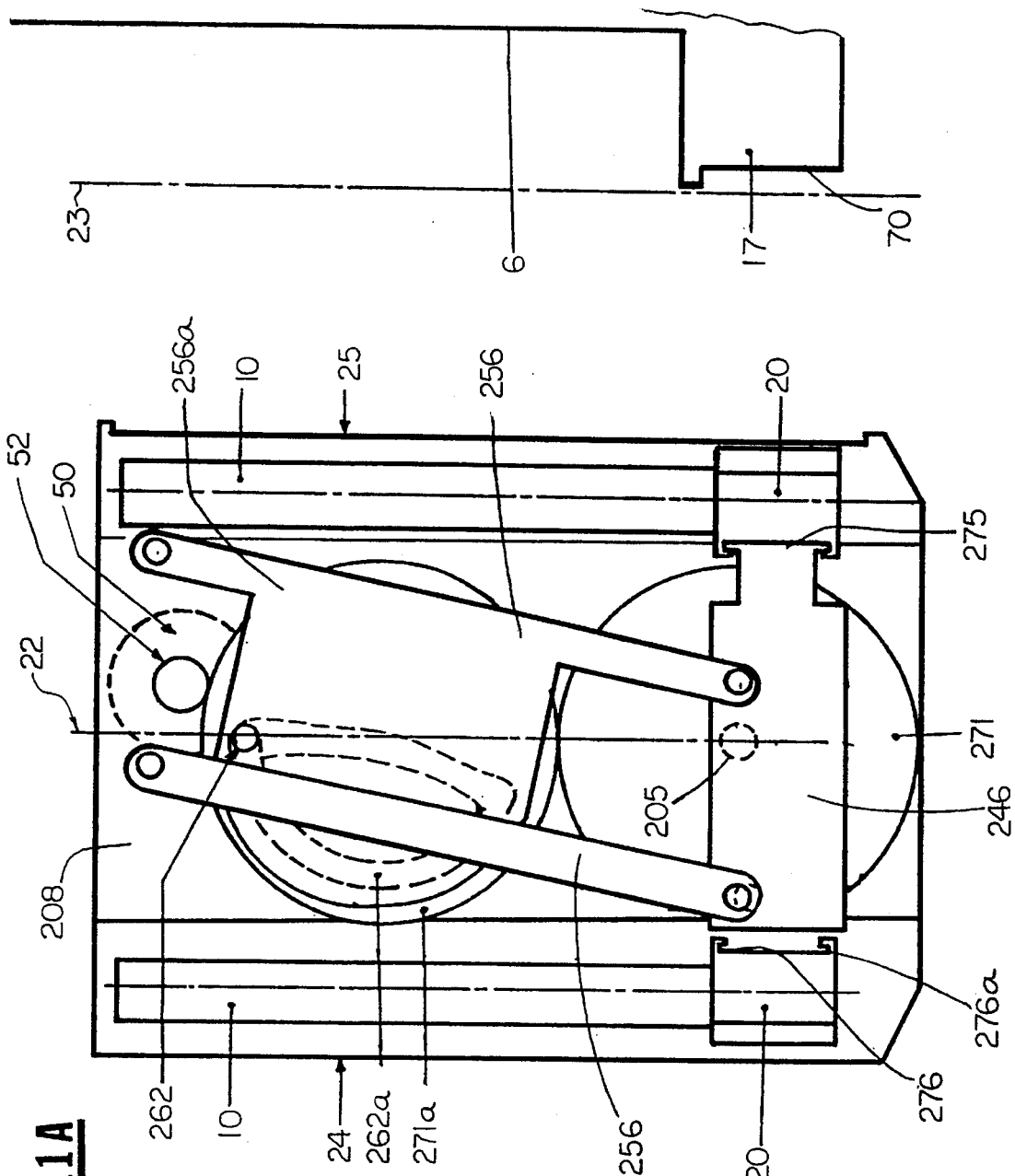

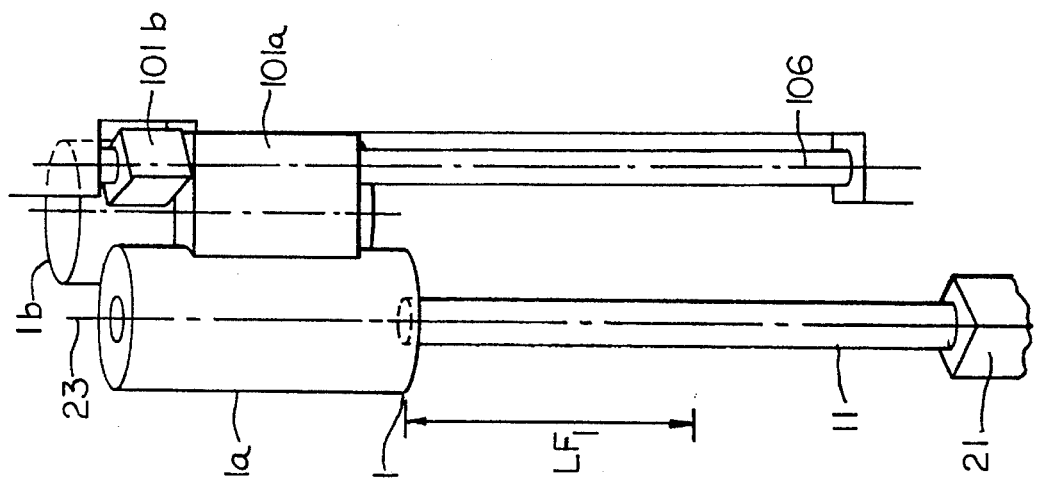
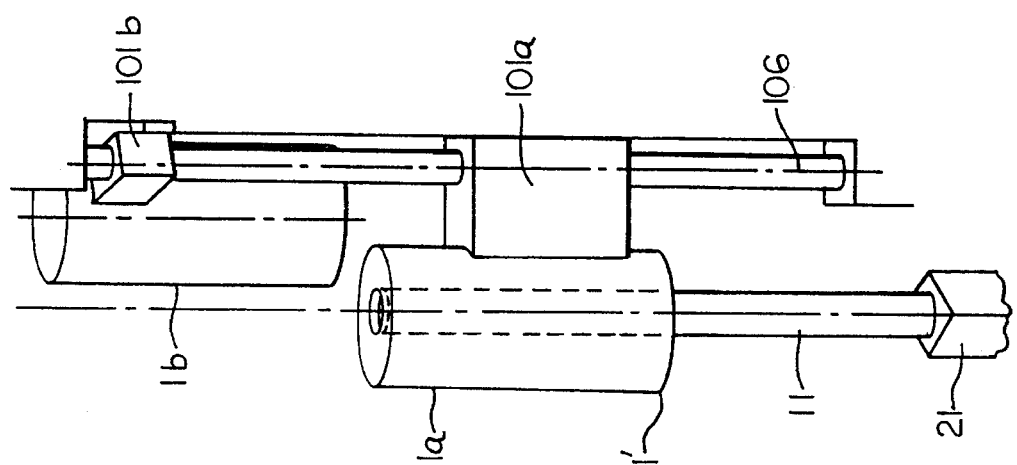
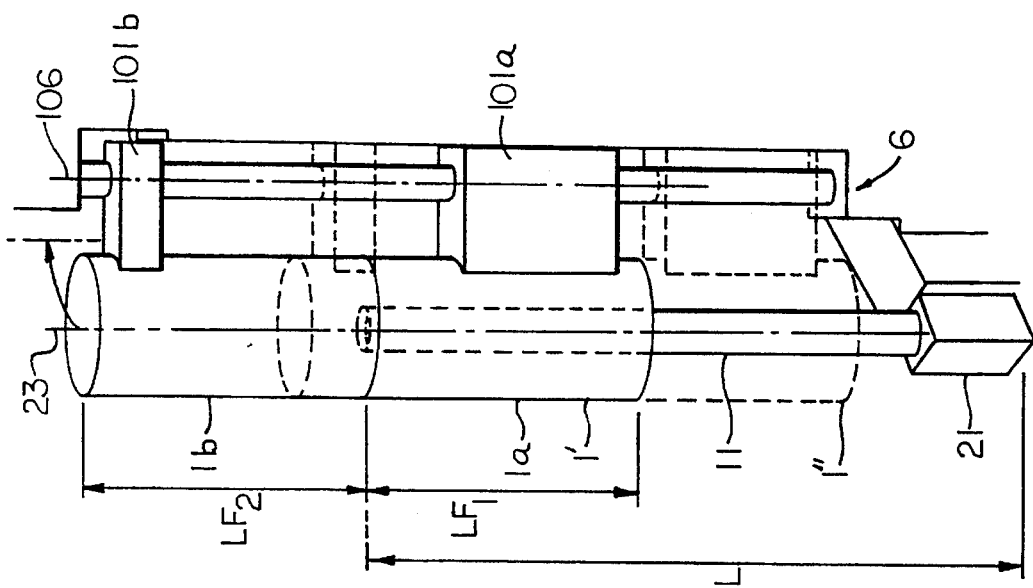

1

LOADER DEVICE FOR AN AUTOMATIC SPACE FURNACE

FIELD OF THE INVENTION

The invention relates in general to control mechanisms for furnaces installed on space stations or satellites and required to operate automatically over long periods, of the order of several months, until visited by an astronaut or until the satellite is recovered.

Automatic space furnaces enable various processes to be performed in microgravity on samples that are placed in cartridges that are closed in sealed manner.

Examples of the processing that can be performed in space furnaces include oriented solidification, in particular of semiconductors such as gallium arsenide, indium phosphide and indium antimonide, or else solidification from the vapor phase, in particular by epitaxy, e.g. for mercury-doped cadmium telluride.

The present invention relates more particularly to a device for loading and unloading the furnace, for use with scaled closed cartridges that have previously been prepared on the ground and stored in a magazine disposed in a space station or a satellite close to a processing furnace, enabling them to be inserted individually and automatically into the furnace, and then to be withdrawn therefrom during a space mission and without human intervention.

PRIOR ART

Automatic devices for exchanging samples in space furnaces are already known, in particular from the communication by R. SRINIVAS and D. SCHAEFER entitled "IAF-87-406 Multiple Experiment Processing Furnace (MEPF): An Overview" given at the 38th Congress of the International Astronautical Federation (IAF) held in Brighton, UK from 10 to 17 Oct. 1987.

In such prior implementations (see FIGS. 15 and 16), the samples are placed in closed cartridges 310, themselves disposed in supports or cartridge-holders 320 mounted in a carousel in a cylindrical storage magazine 309 which is placed in line with an assembly 302 constituting an enclosure in which the processing furnace is contained. The storage magazine 309 has an axis of rotation parallel to the longitudinal axis of the furnace, but offset therefrom so that, by rotating the carousel, the cartridges 310 are brought successively into a position 311 which is in alignment with the longitudinal axis of the furnace. The holder 321 of the cartridge 311 that is to be inserted into the furnace is then taken hold of by a mechanism 316 that moves the cartridge in translation into the furnace. The furnace 301 is itself fitted with a drive mechanism (not shown in the drawings) for moving it in translation along guide rods so as to enable the sample placed in the working cartridge 311 to be subjected to different temperature zones, as required for performing solidification, for example.

Prior art automatic furnaces such as those described in the abovementioned article thus make use of three different mechanisms for loading and unloading cartridges and for processing the samples in cartridges in the working position, namely: a mechanism for rotating the carousel disposed in the magazine 309 for storing the cartridges 310; a mechanism 316 for displacing the cartridge 311 that is to be loaded or unloaded; and a translation drive mechanism for the processing furnace 301. Loader devices for known automatic furnaces are thus relatively complex and difficult to implement, in particular since the cartridge 311 containing the sample to be processed also has a connector provided with electrical contacts for various measurement signals, so it is necessary to enable a proper connection to be made between said connector and a complementary connector associated with the furnace while the cartridge is in the working position. Implementing automatically pluggable connectors in devices that are subjected to large-amplitude translation movement presents problems of alignment and of insertion force.

Prior art furnace loader devices of the type in which cartridges are moved in translation from a magazine superposed on the furnace are also very bulky, in spite of the fact that the volume available in space stations or satellites is always highly restricted.

Thus, with reference to FIG. 16, it can be seen that the conventional disposition of a process chamber 302 containing a furnace and of the automatic furnace loader assembly 309 in a housing 314 formed in the wall 313 of a space vehicle requires the housing 314 to have a minimum total height h such that:

$$h > 2L + s + P$$

where:

L=the length of the cartridge 311;

s=the stroke of the furnace between positions 301' and 301", e.g. for a solidification process; and P=additional space to enable the carousel 309 to be manipulated (of the order of about 10 cm).

In practice, the height h, which naturally depends on the type of furnace, is generally at least about one meter (m) and the opening 315 enabling the magazine 309 to be exchanged must be not less than L+P, which is about 50 cm to 60 cm in practice.

OBJECT AND BRIEF SUMMARY OF THE INVENTION

The invention seeks to remedy the above-specified drawbacks of prior art devices, and in particular to simplify the mechanical devices for automatically positioning and exchanging cartridges between a storage magazine and a working furnace.

More particularly, the invention seeks to provide a loading and unloading device for a space furnace that is compact, lightweight, simple, reliable, and does not give rise to angular or linear momentum that could affect the stability of the satellite or the station incorporating the device.

The invention also seeks to enable electrical connections to be made more reliability between a cartridge in the working position and the support structure of the processing furnace.

These objects are achieved by a loader device for an automatic space furnace for processing purposes, the furnace having a longitudinal axis and means for driving the furnace in translation in guided manner along said longitudinal axis, the loader device being disposed in the vicinity of the furnace and comprising a cartridge-carder carousel provided with a set of cartridge-holders in which sealed, closed cartridges are removably mounted, each cartridge being designed to contain a sample for processing in said space furnace, all of the cartridges being disposed in the carousel parallel to its axis of rotation, the loader device further comprising a control mechanism for imparting indexed rotary drive to the cartridge-holders, wherein the carousel is mounted to one side of the furnace in such a manner that its axis of rotation is parallel to the longitudinal axis of the furnace, wherein each cartridge-holder of the carousel co-operates with a transfer mechanism including a translation arm extending perpendicularly to the axis of rotation of the carousel to enable each cartridge to be brought successively into a working position in which the axis of the cartridge is in alignment with the longitudinal axis of the furnace, and wherein the control mechanism for imparting rotary drive to the cartridge-holders and to the transfer mechanism are activated alternately by a single electric motor.

Compared with existing systems, the invention makes it possible to reduce the bulk of the assembly comprising the space furnace and the loader device, and it also makes it possible to reduce the mass of that assembly by omitting one of its mechanisms. Once the cartridge for engagement in the furnace has been displaced laterally by the transfer mechanism, while remaining parallel to the axis of rotation of the carousel, it can be engaged in the furnace merely by moving the furnace in translation. The transfer mechanism is itself intimately associated with the mechanism for controlling rotary drive to the cartridge-holders, thereby making it possible to have an assembly that is more compact and that is controlled by one motor only.

The greater simplicity of the system increases the reliability of the assembly, and that is most important for space equipment, since failure of a furnace to operate would represent major loss, and would require special intervention by an astronaut, which is itself very expensive.

In the common circumstance of the samples comprising substances that are highly toxic, the carousel and the mechanisms for controlling rotary drive to the cartridge-holders and for controlling transfer are placed inside a hermetic container which is provided with a closeable side opening so as to provide security against possible leaks from the cartridges during transport until they are put into orbit. The door closing the opening is opened selectively to enable a cartridge to pass therethrough during processing operations in space.

The furnace and the carousel can be installed in various different configurations, all of which are more compact than systems in which cartridges are transferred into the furnace by translation from a magazine situated in line with the furnace.

In a particular embodiment, the control mechanism for imparting rotary drive to the cartridge-holders comprises a shaft disposed perpendicularly to the translation arm, having one end disposed to receive rotary motion from an electric motor and having its other end disposed to drive a Maltese cross device acting on the cartridge-holders.

In which case, more particularly, the Maltese cross mechanism comprises a finger for controlling rotation that acts on grooves formed in the cartridge-holders parallel to the axis of the carousel, and a cam co-operating with openings formed in the cartridge-holders to perform locking in each indexed position.

The transfer mechanism comprises at least two arms hinged firstly to a stand fixed to the bottom of the carousel and extending perpendicularly to said bottom, and secondly to the translation arm to co-operate with the translation arm to constitute a parallelogram linkage.

The translation arm has projecting portions capable of being received in grooves of complementary profile formed in the cartridge-holders, when a cartridge-holder is in position facing the translation arm.

In a first possible embodiment, the transfer mechanism comprises a guide fixed to the translation arm and extending perpendicularly thereto, and a finger engaged in the guide and secured to a plate occupying a plane parallel to said stand and capable of being selectively driven, under the control of a clutch device, from a driving toothed wheel whose axis is perpendicular to the plane of the stand and which meshes with a step-down gear wheel disposed at the outlet from the electric motor.

The control mechanism for imparting rotary drive to the cartridge-holders comprises a disk extending in a plane parallel to the stand, which disk is secured to the shaft having the Maltese cross device attached thereto and is capable of being selectively driven under the control of the clutch device from the driving toothed wheel when the plate of the transfer mechanism is itself declutched relative to the driving wheel.

Preferably, resilient elements are interposed between the guide and the translation arm.

In this first embodiment, during two revolutions of the driving toothed wheel: the first revolution corresponds to a step of the carousel rotating through one step and to the cartridge-holders being locked in place, while the disk which is secured to the shaft that is connected to the Maltese cross device is clutched to the driving toothed wheel, and while the plate of the transfer mechanism is declutched from the driving toothed wheel; and the second revolution corresponds to a step of extracting a cartridge from the carousel, of processing the extracted cartridge in the furnace, and of returning the cartridge, while the disk which is secured to the shaft having the Maltese cross device secured thereto is declutched from the driving toothed wheel, and while the plate of the transfer mechanism is clutched to the driving toothed wheel.

In a second embodiment, during one revolution of the first driving toothed wheel, during the first half-revolution, the parallelogram linkage of the transfer mechanism is held stationary in its retracted position by the cam having a semicircular profile centered on the first drive wheel, while rotation of the first and second driving toothed wheels causes the cartridge-holders to rotate through one step, and during the second half-revolution, rotation of the second driving toothed wheel locks the carousel in the position it has previously acquired, while rotation of the first driving toothed wheel drives the finger along an arcuate return portion of the cam such that during a first half of the second half-revolution, the translation arm advances to bring a cartridge into the working position in the furnace, and during the second half of the second half-revolution, the translation arm retracts, thereby returning the processed cartridge to the carousel.

When a clutch device is used, it may be of the passive type, or else it may be of the active type, e.g. based on an electromagnet.

In a particular embodiment, the clutch device is of the passive type and comprises an actuator element provided with two pairs of opposite plane faces, which actuator device revolves in the driving toothed wheel and co-operates with a cross-shaped wheel which possesses four stable positions and which, on each revolution of the driving toothed wheel, is rotated through 90° by means of a finger, thereby locking the actuator element, either in a recess formed in the disk, or else in a recess formed in the plate.

In a particular aspect of the invention, each cartridge-holder comprises an essentially plane interface for mechanical positioning and for electrical connection adapted to co-operate with a single, essentially plane complementary interface for mechanical positioning and for electrical connection disposed on means for supporting the means that drive the furnace in translation.

BRIEF DESCRIPTION OF THE DRAWINGS

Other characteristics and advantages of the invention appear from the following description of particular embodiments given as non-limiting examples, and described with reference to the accompanying drawings, in which:

FIG. 1 is a diagrammatic axial section view of an automatic space furnace fitted with a lateral cartridge-exchange device, in accordance with the invention and designed to receive a batch of cartridges axially;

FIG. 2 is a diagrammatic axial section view of a vertically mounted space furnace associated with a lateral cartridge-exchange device in accordance with the invention;

FIGS. 10A to 10C are elevation views showing embodiment details of a passive type clutch device applicable to the embodiment of FIGS. 3 to 6;

FIG. 11 is an elevation view of a second embodiment of a furnace loader device of the invention, placed in its retracted position;

FIGS. 17a, 17b, and 17c show a two-portion furnace which is applicable to a cartridge-exchange device in accordance with the invention, the furnace being shown respectively with two portions in alignment, two portions that are superposed but have their axes offset, and two portions that are juxtaposed with their axes offset.

DETAILED DESCRIPTION OF PARTICULAR EMBODIMENTS

Figure 3:
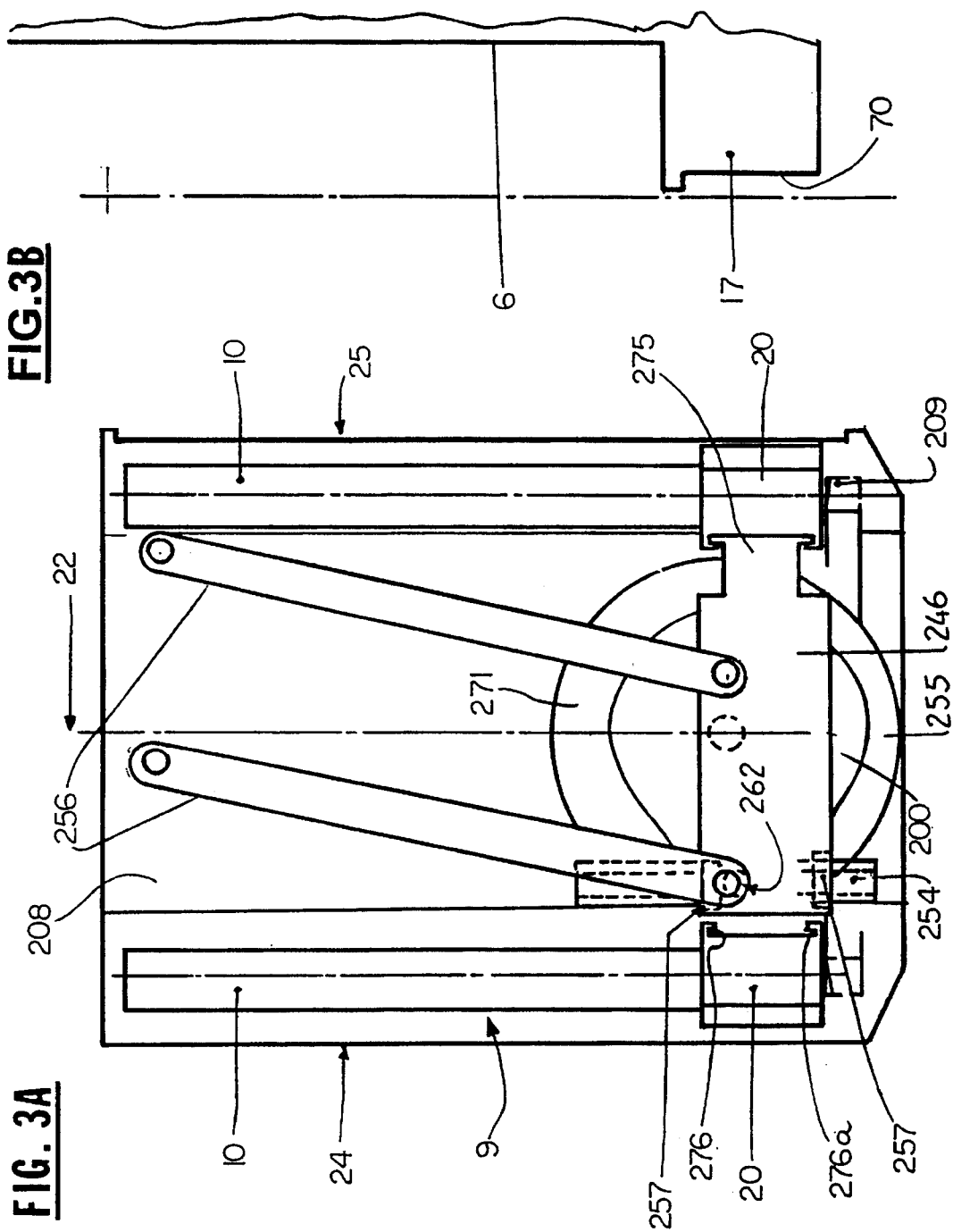
FIGS. 3 and 4 are elevation views of a first embodiment of a furnace loader device of the invention, shown respectively in its retracted position and in its loading position.

Reference is made initially to FIG. 1 which shows an enclosure 2 of a space furnace that defines a process chamber designed to be installed in a housing within a satellite or a space station.

Reference 3 designates a removable portion of the enclosure 2 which is provided with sealed feed-through members and which is connected to the main body of the enclosure 2 via a flange connection 5.

A furnace 1 proper is inserted in the enclosure 2 when the portion 3 is dismounted, and it is mounted on a support device 6 which may, for example, include columns or a guide bedplate so that the furnace 1 can be moved in translation along its longitudinal axis 23 in order to take up the position 1'' shown in dashed lines in FIG. 1. The mechanism for moving the furnace 1 in translation along the support device 6 may itself be conventional.

A compartment 8 containing a batch of cartridges 10 and a mechanism for loading and unloading the cartridges 10 is also attached to the main body of the enclosure 2, on one side thereof, and it is connected to the enclosure 2 by a flange connection 7.

In accordance with the invention, the batch of cartridges 10 is mounted inside the compartment 8 in cartridge-holders 20 which are mounted so as to constitute a carousel 9. According to an essential characteristic, the axis of rotation 22 of the carousel 9 is parallel not only to the cartridges 10 stored in the rest position inside the compartment 8, but also to the longitudinal axis 23 of the furnace 1.

Because of this particular disposition of the compartment 8 for storing the cartridges 10 in the immediate proximity of the furnace 1, and on one side thereof, the enclosure 2 can be very compact and, above all, each cartridge 10 can be inserted very easily into the furnace 1 merely by moving its cartridge-holder 20 in lateral translation along an axis perpendicular to the axis 22 of the carousel 9 and to the axis 23 of the furnace 1. The mechanism 12 for imparting indexed rotary drive to the carousel 9 for the purpose of bringing a new cartridge 10 into the vicinity of the furnace 1 co-operates with means for controlling transfer of the cartridge 10 so as to bring the cartridge-holder 20 and the cartridge 10 into a working position. The cartridge-holder and the cartridge, when in the working position, are respectively referenced 21 and 11 in the drawings. When the cartridge 11 is in alignment on the axis 23 of the furnace 1, after performing simple lateral translation motion triggered by the rotary drive mechanism 12 of the carousel, it suffices to position the cartridge 11 in the desired longitudinal position relative to the furnace 1 merely by moving the furnace 1 in translation along its support 6. In FIG. 1, dashed lines show a position 1'' in which the cartridge 11 is almost completely engaged inside the furnace.

In the embodiment of FIG. 1, a cover 8a is disposed at the bottom of the compartment 8 to enable the batch of cartridges 10 and the carousel 9 to be inserted or removed axially. In a variant embodiment, the opening through which the carousel 9 is loaded could be a lateral opening.

FIG. 2 shows one example of how it is possible to dispose, in a space vehicle, an enclosure 2 containing a furnace 1, a compartment 8 for storing cartridges 10, a mechanism for moving the furnace in translation, and a mechanism for driving rotation of the carousel and for transferring a cartridge (not shown), the entire assembly constituting a process chamber.

The enclosure 2 is mounted through an opening 15 in a housing 14 in a wall 13 of a space vehicle.

In FIG. 2, the furnace 1 extends vertically, i.e. parallel to the wall 13, while the compartment 8 and the carousel it contains are also parallel to the wall 13 and are situated laterally relative to the furnace 1.

In the assembly shown in FIG. 2, the total height h of the enclosure 2 must be such that:

$h > L + L_f$ where:
L=the length of the cartridge;
$L_f$=the length of the furnace, i.e. about 80% of the length L in practice; and
D=the diameter of compartment 8 containing the carousel 9.

Figure 16:
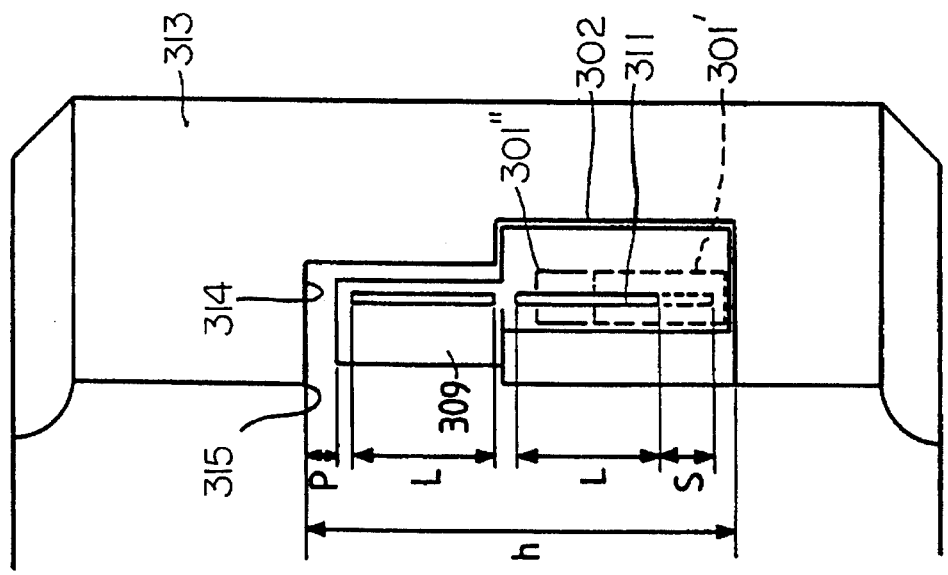
FIG. 16 is a diagrammatic axial section view of a vertical space furnace associated with a prior art cartridge-exchange device placed in line with the furnace.
Figure 15:
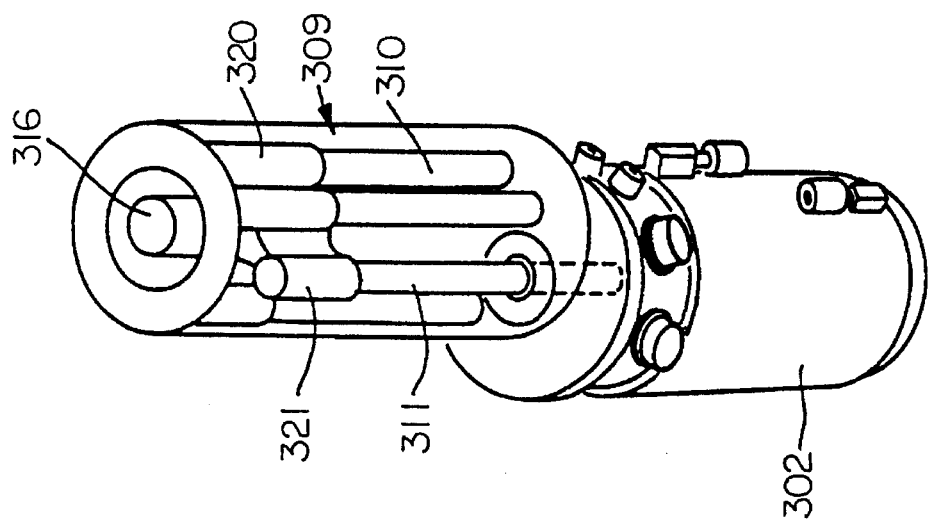
FIG. 15 is a perspective view of a space furnace associated with a prior art cartridge-exchange device.

It can be seen that the minimum height h for the assembly shown in FIG. 2 is about 35% to 45% smaller than the minimum height required for a conventional assembly, as shown in FIG. 16. In particular, when determining the minimum height of the housing 14, consideration is no longer taken of the stroke s of the furnace 1 between the extreme positions 1' and 1" that it takes up during sample processing, e.g. for performing solidification. Similarly, the diameter D of the compartment 8 is taken into consideration only for the lateral positioning of the compartment and is not a constraint when determining the total height of the enclosure.

By way of example, for the assembly parameters marked in FIGS. 2 and 16, typical values may be as follows:

| L = 400 mm | P = 100 mm |
|---|---|
| $L_f$ = 300 mm | D = 200 mm |
| s = 120 mm | |

Under such circumstances, the minimum value for the height h is $h_1$=650 mm for the assembly shown in FIG. 2, whereas it is $h_2$=1020 mm for the assembly shown in FIG. 16.

It may also be observed that, since the cartridge 11 is displaced laterally into its working position by moving in translation and not by being tilted, there is no longer any need to leave empty space between the starting position for moving the furnace (referenced 1" in FIG. 2) and the cartridge-holder in order to make allowance for the diameter of the furnace. The minimum height h is thus reduced relative to a loader mechanism of the type that tilts cartridges by quite a considerable amount, which in practice may be of the order of 20% to 30%.

In particular, for cartridges of large size, e.g. of length L=800 mm, having a diameter D=60 mm, and associated with a furnace of length Lf=600 mm, the saving in necessary minimum height h is considerable compared with tilting type mechanisms.

Nevertheless, the invention may combine tilting or pivoting movements with translation movements. Thus, the invention is applicable to furnaces having two heating zones, 1a and 1b of lengths $L_{F1}$ and $L_{F2}$, e.g. each being 300 mm long. Under such circumstances, the total height of the instrument can be reduced if one of the zones 1b is pivoted at the end of its stroke and the other zone 1a is moved in translation. When using cartridges of large size, having a length L=800 mm, the total height h will be equal to no more than $L+L_{F2}$=1100 mm.

FIG. 17a shows the furnace in position 1' with the two heating zones of lengths $L_{F1}$ and $L_{F2}$ being defined by blocks 1a and 1b which are superposed and in alignment on an axis 23 that also coincides with the axis of the cartridge 11 being processed. The position of the furnace assembly 1" corresponding to the beginning of solidification is shown in dashed lines. The lateral support 6 of the furnace comprises a column 106 whose axis is parallel to the axis 23 on which the furnace 1a, 1b is positioned. The two blocks 1a and 1b of the furnace are connected to the lateral support 6 by connection elements 101a and 101b capable of sliding along the column 106 or of pivoting about the column.

FIG. 17b shows the furnace in an end-of-work position that comes after the position drawn in solid lines in FIG. 17a. In the position of FIG. 17b, the block 1b and its connection element 101b has been pivoted about the column 106.

The block 1a remains in the position 1' of FIG. 17a, i.e. it is located below the block 1b, but it is angularly offset relative to the block 1b which constitutes the element furthest from the holder 21 of the cartridge 11 to be processed.

FIG. 17c shows the furnace in position 1 where block 1a has been displaced in translation through a distance $L_{F1}$ along the axis 23 and is placed beside the block 1b which has been pivoted out of the way, thereby enabling the cartridge 11 to be removed and a new cartridge to be installed. In the position of FIG. 17c, the furnace occupies reduced height since the two blocks 1a and 1b are situated side by side, and are no longer in alignment as in the working position of FIG. 17a.

The present invention is particularly useful when the furnace 1, or possibly a magnet surrounding the furnace, is large in diameter.

The diameter of the furnace is not taken into account when determining the total height h of the enclosure 2 and the room available inside the carousel 9 makes it possible to have the axis of the furnace 23 offset from the carousel by a distance equal to the mean cartridge storage diameter minus twice the width of a cartridge-holder.

Between missions, cartridges 10 can be loaded into the carousel 9 and the compartment 8 and can be removed therefrom in a very wide variety of ways. Thus, in the embodiment of FIG. 2, the cartridges 10 may be installed in the compartment 8 or withdrawn therefrom by removing a cover 8a situated at the end that is remote from the cartridge-holders, thereby enabling the cartridges to be manipulated without passing through the cartridge-holders.

Nevertheless, in the embodiment shown in FIG. 1, the cover 8a is situated adjacent the cartridge-holders 20 such that, between two processing sequences, the cartridges 10 are loaded and unloaded through the cartridge-holders 20.

Figure 12:
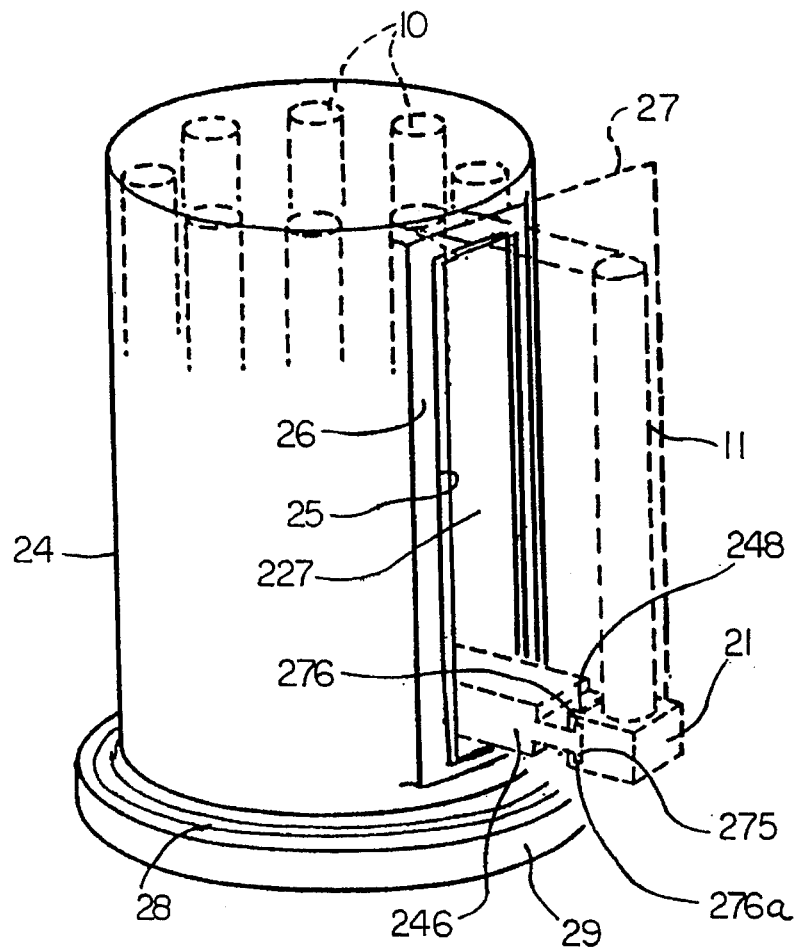
FIG. 12 is a perspective view showing a furnace loader device of the invention placed in an enclosure that is provided with a closeable opening.

FIG. 12 shows a cartridge-exchange process of the invention, with a cartridge 11 to be processed being shown in its working position where it is in alignment with the axis 23 of the furnace 1.

The carousel 9 or turntable carries a set, e.g. 6 to 32 of cartridge-holders 20 in which cartridges 10 containing samples to be processed are removably engaged. The cartridges 10 are mounted on the cartridge-holders by conventional coupling means, e.g. involving welding (not shown in the drawing). The coupling between a cartridge 10 and its supporting holder 20 also includes electrical pathways to enable connections to be made with measurement sensors incorporated in the cartridge.

A single electric motor 50 (described below with reference to FIG. 9) imparts drive to the mechanism for rotating the carousel 9. When a cartridge to be processed that is stored in the carousel 9 comes close to the plane defined by the axis of rotation 22 of the carousel 9 and the longitudinal axis 23 of the furnace 1, then the mechanism for rotating the carousel 9, which is also associated with cartridge transfer means, serves automatically to cause the holder 21 of the cartridge 11 to be processed to be moved in translation so as to bring it into the processing position shown in dashed lines in FIG. 12, where the axis of the cartridge coincides with the axis 23 of the furnace 1.

Positioning accuracy can be defined by fitted surfaces such as complementary V-shaped portions disposed respectively on the holder 21 of the cartridge to be processed and on the end 17 of the support 6 on which the mechanism for moving the furnace in translation is mounted (FIG. 1).

Examples of the mechanism of the controlling rotation of the carousel 9 and translation of the cartridge-holders 20 are described below.

When a cartridge 11 is in the processing position, an electrical connector placed on the cartridge-holder 21 is automatically put into contact with a corresponding electrical connector placed on the end 17 of the support 6. However, in a variant, it is also possible to associate each cartridge with a flexible cable that is connected to a rotary contactor on the same axis as the carousel 9 and co-operating with the electrical connector placed on the end 17 of the support 6.

FIG. 12 shows a particular embodiment in which the carousel 9 is enclosed in a hermetic compartment 24 containing all of the cartridge-holders 20 and the cartridges 10. An oblong side opening 25, whose mid-line lies on the plane defined by the axis of rotation of the carousel and the axis 23 of the furnace, enables a cartridge 11 to be processed to move into the processing position. The opening 25 is selectively closed by a moving panel 27 beating against the sealing surface 26 that surrounds the opening 25. During transport, the panel 27 is closed and prevents any toxic substances contained in the cartridges from escaping to the outside in the event of an accident. When the carousel 9 is loaded in the process chamber 2 (FIGS. 1 and 2), the panel 27 is opened to allow cartridges to be extracted. Sealing between the process chamber and the carousel 9 is obtained by a flange 29 beating against a sealing ring 28, for example. The panel 27 may operate by sliding or by pivoting.

While a cartridge 11 to be processed is being moved in translation by the transfer mechanism driving the cartridge-holder 21, the furnace 1 is in its retracted position shown in dashed lines in FIG. 2. The mechanism for moving the furnace in translation, which may itself be conventional, moves the furnace through a first stroke it that enables the cartridge 11 to be processed to be inserted in part in the furnace 1 (position 1'). This stroke a may typically be 100 mm to 200 mm. When the processing corresponds to oriented solidification of a sample, the furnace 1 is heated to initiate melting of the material contained in the cartridge 11. The furnace 1 then moves down its stroke s which may be about 100 mm to 200 mm, for example, until it reaches the position 1" shown in solid line in FIG. 2, thereby melting the material to be melted. The furnace then returns from its position 1" to its position 1' as shown in dashed lines by moving through a distance defined by the stroke s, thereby giving rise to oriented solidification of the material. The furnace is then cooled and returned to position 1 shown in dotted lines in FIG. 2 by moving through the additional stroke a that enables the cartridge 11 to be withdrawn and returned to the carousel by moving the cartridge-holder 21 in translation. After the carousel 9 has rotated through an angle to bring another cartridge 10 into the vicinity of the plane defined by the axes 22 and 23, the process of movement in translation and of processing can be repeated on the new cartridge.

It will be observed that, with a space furnace, all of the various movements imparted to the cartridges and to the furnace are very slow, and therefore have very little repercussion on the attitude of the space vehicle carrying the furnace. The slowness of the movements in weightlessness, together with the fact that the centers of gravity of the members of the cartridge-exchange device move very little, makes it possible to reduce the stresses to which the mechanical members are subjected, which has the effect not only of increasing reliability, but also of making it possible to reduce the masses of these various members and of the power supply that controls the mechanism, and thus of achieving savings in the operation of putting the satellite into orbit. In addition, disturbances to micro-gravity are very small.

A first embodiment of a furnace loader device of the invention is described below with reference to FIGS. 3 to 10. In this embodiment, each cartridge-holder 20 of the carousel 9 co-operates with a transfer mechanism 200 including a translation arm 246 perpendicular to the axis of rotation of the carousel and situated in the plane defined by the axis of rotation 22 of the carousel and the furnace axis 23, thereby enabling each cartridge 10 in succession to occupy a working position 11 in which the axis of the cartridge is in alignment with the axis 23 of the furnace 1. According to the invention, the mechanism 12 for controlling rotary drive of the cartridge-holders 20 and the transfer mechanism 200 cooperate and are activated in alternation using a single electric motor 50 (FIG. 9).

Figure 4:
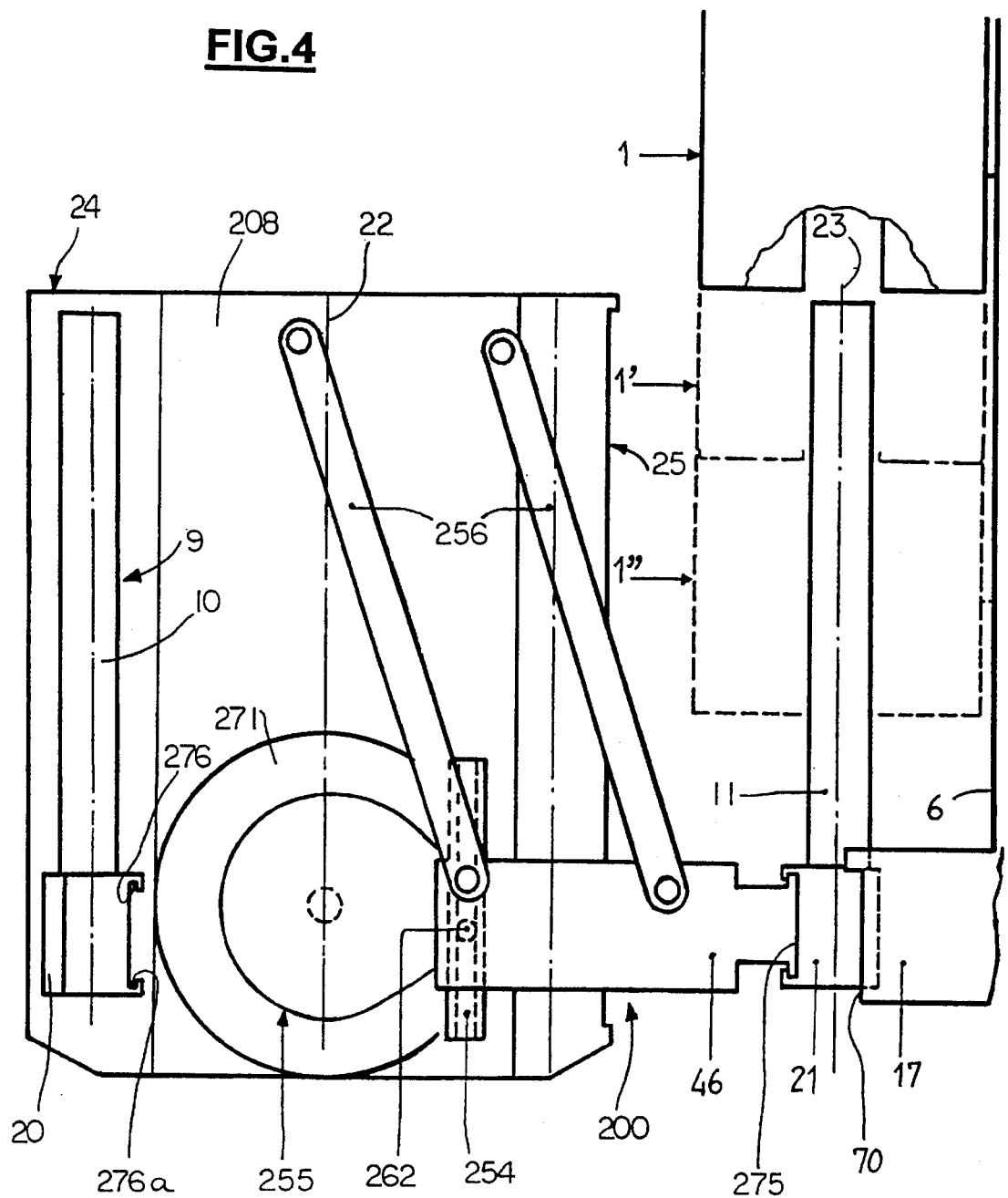
Figure 9:
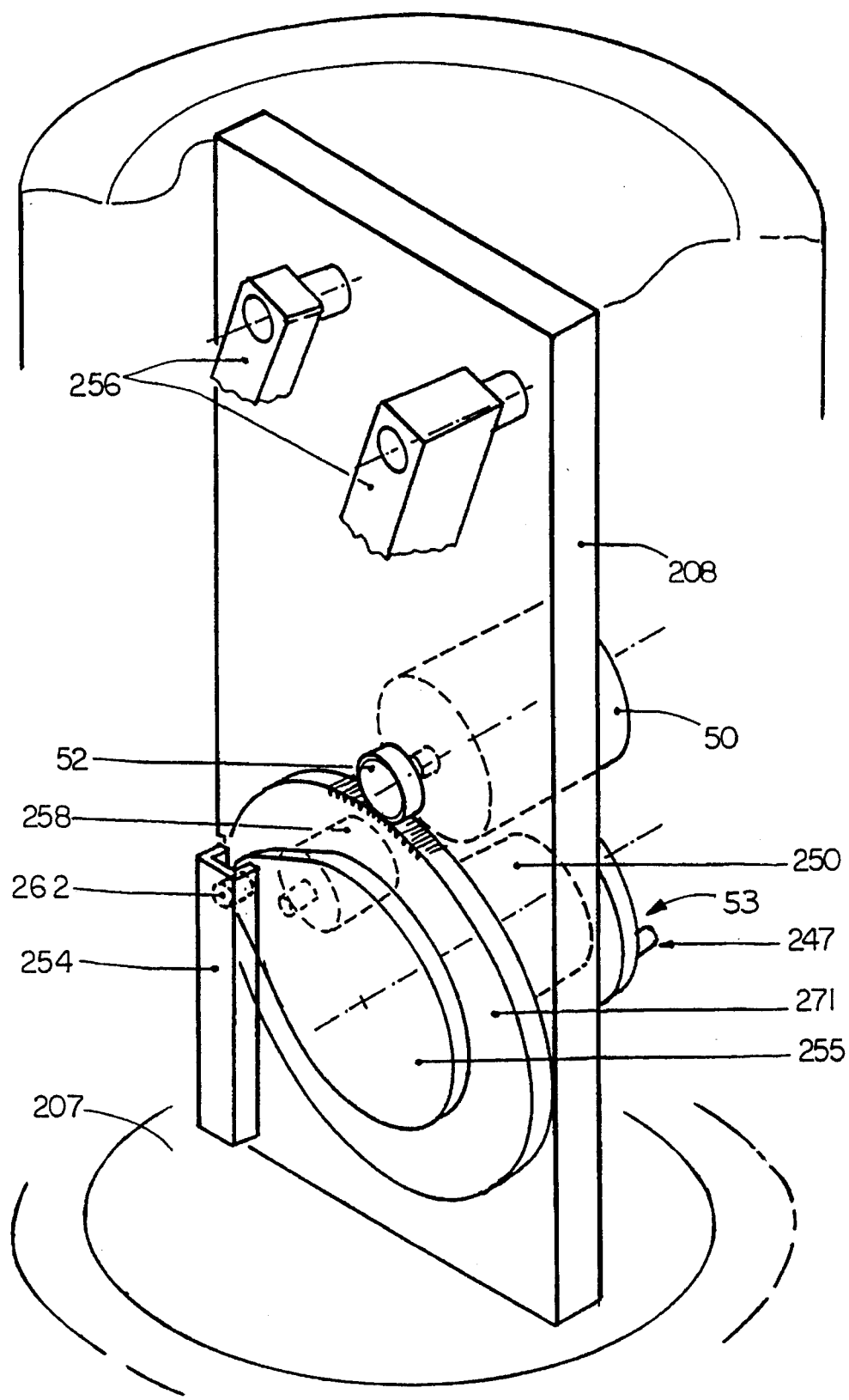
FIG. 9 is a perspective view of a portion of the furnace loader device of FIGS. 3 to 6, showing the members for providing drive in rotation and in translation.
Figure 13:
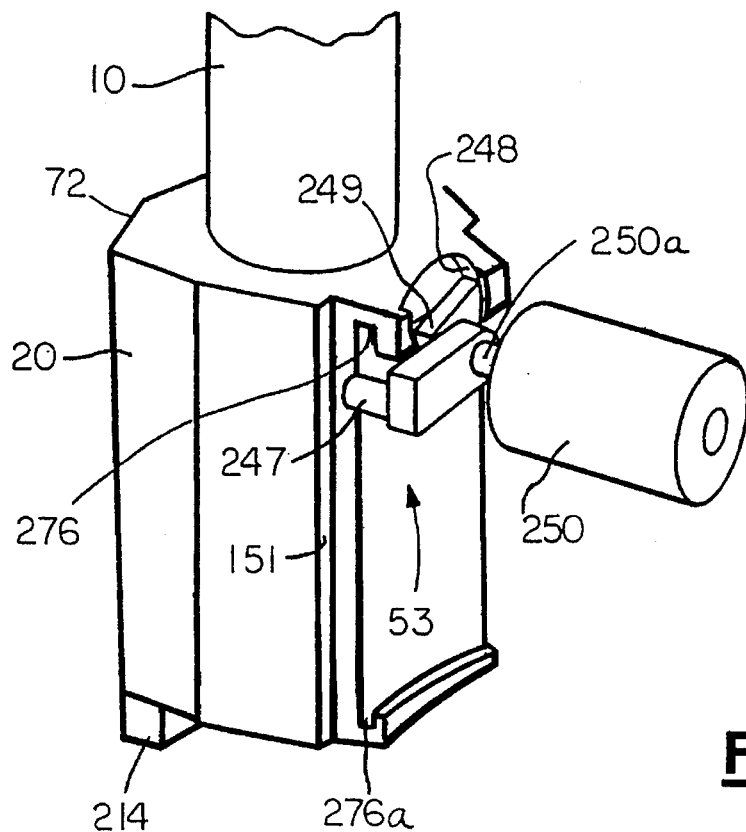
FIG. 13 is a perspective view of a particular embodiment of a mechanism for controlling rotation of the carousel and applicable to the present invention.

As can be seen in FIGS. 3, 4 and 9, the transfer mechanism 200 comprises at least two arms 256 which are hinged at their top ends to a vertical stand 208 fixed to the bottom 207 of the carousel 9 and extending perpendicularly to said bottom 207, and which is preferably also fixed to the cover of the carousel housing so as to strengthen the assembly. The bottom ends of the arms 256 are hinged to a translation arm 246, thereby constituting a parallelogram structure.

Figure 5:
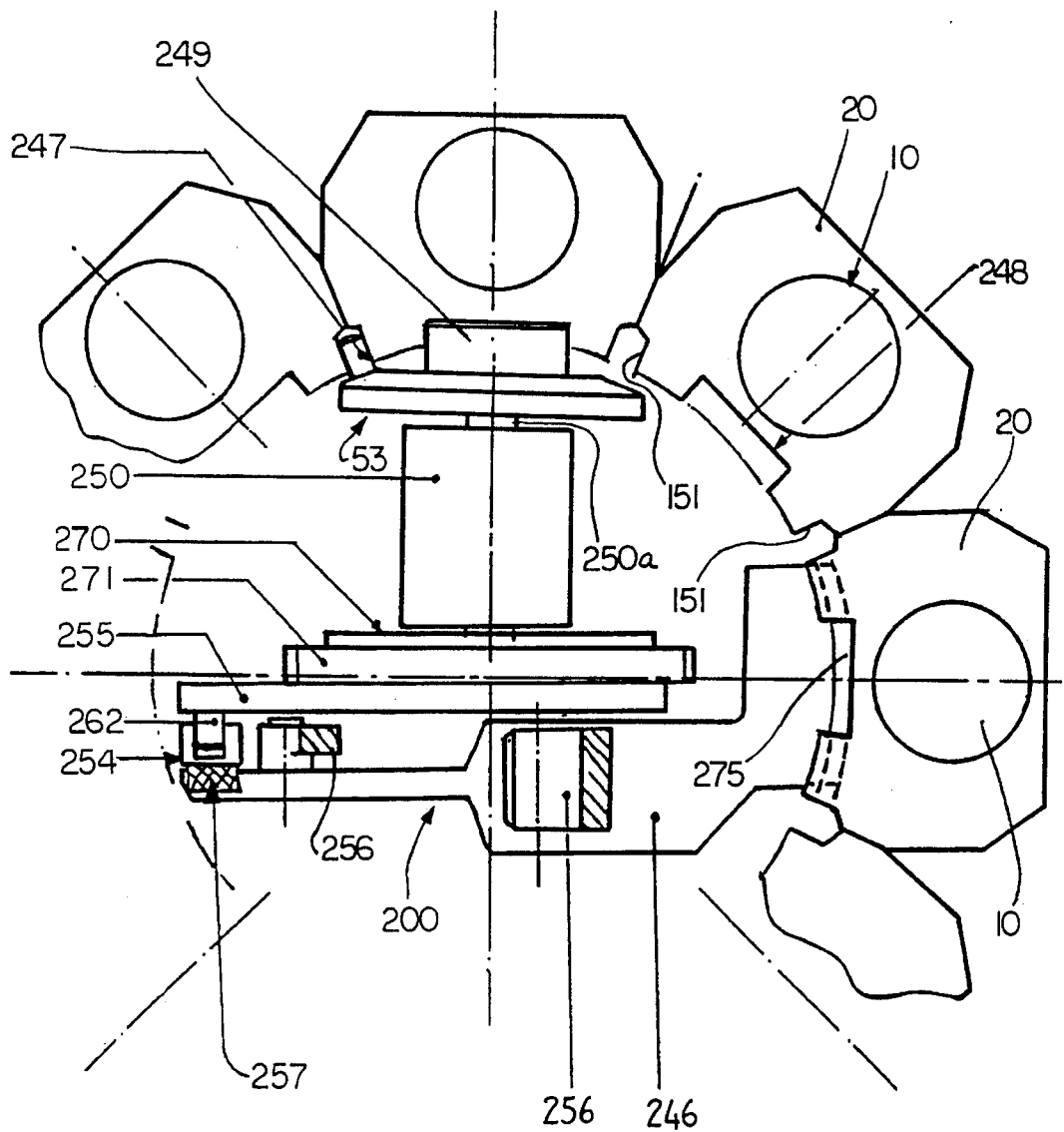
FIGS. 5 and 6 are plan views of the furnace loader device and corresponding to FIGS. 3 and 4, respectively.
Figure 6:
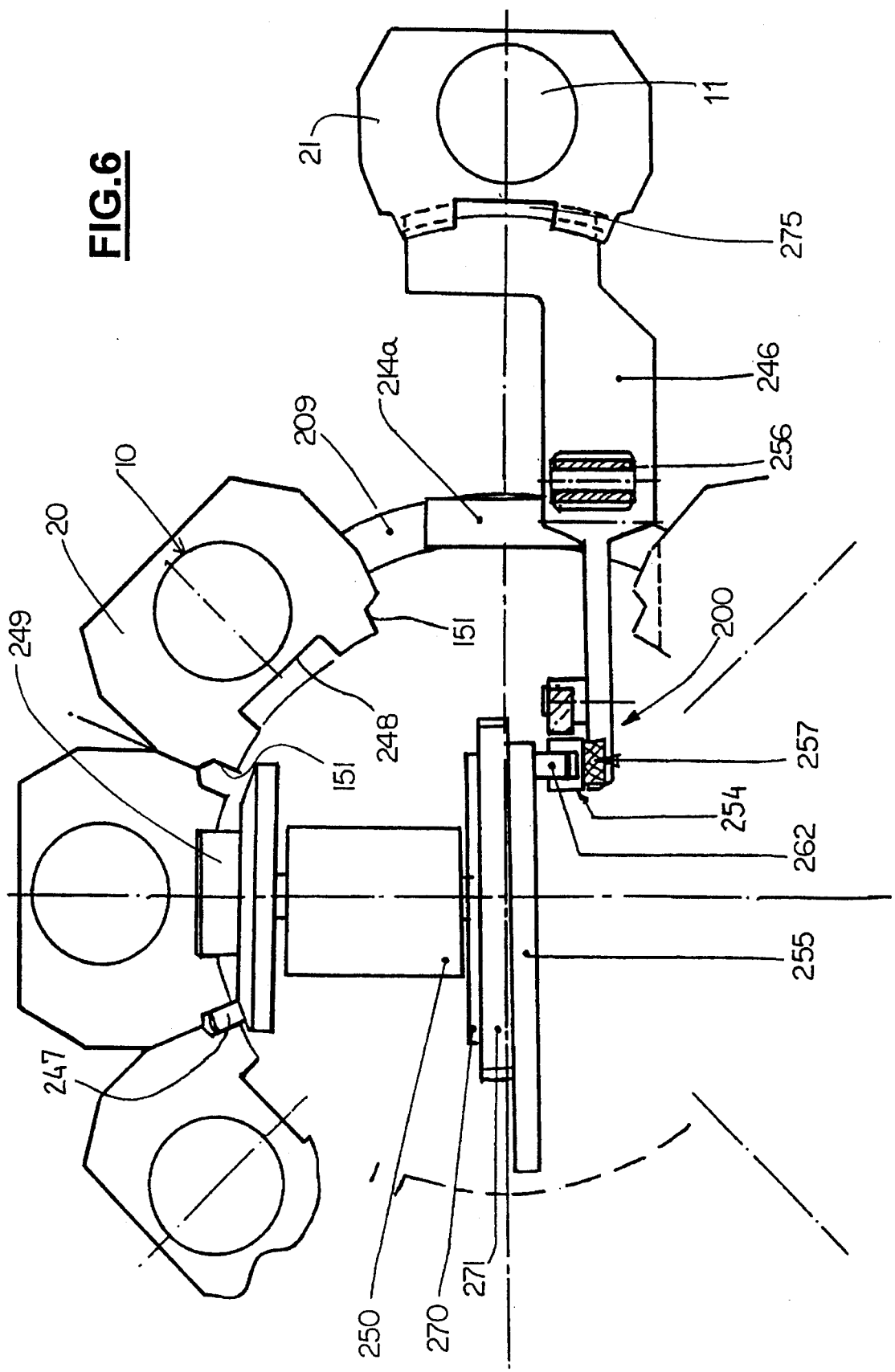

The mechanism 12 for controlling rotary drive of the cartridge-holders comprises a shaft 250a extending perpendicularly to the translation arm 246, with one end of the shaft receiving rotary motion from an electric motor 50, while its other end drives a Maltese cross device 53 that acts on the cartridge-holders 20 (FIGS. 5, 6 and 9). The shaft 250a is mounted in a bearing 250.

More particularly, as can be seen in FIGS. 5, 6, 9 and 13, the Maltese cross device 53 comprises a finger 247 for controlling rotation by acting on grooves 151 formed in the cartridge-holders 20 parallel to the axis 22 of the carousel, and a cam 249 co-operating with openings 248 formed in the cartridge-holders 20 to provide locking in each indexed position.

The electric motor 50 is preferably disposed horizontally, and it cooperates with a step-down gear wheel 52, as shown in FIG. 9.

In the embodiment shown in particular in FIGS. 3 to 6 and 9, the transfer mechanism 200 comprises a guide 254 which is fixed on the translation arm 246 and extends perpendicularly thereto, parallel to the axis of rotation 22 of the carousel 9. The guide 254 receives a finger 262 that is secured to a plate 255 lying in a plane that is parallel to the stand 208.

The plate 255 is driven selectively by a toothed drive wheel 271 disposed parallel to one of the main faces of the stand 108, with drive being selected by means of a clutch device 258. The toothed wheel 271 meshes with the gear wheel 52 at the outlet from the electric motor 50.

A disk 270 whose plane is parallel to the main faces of the stand 208, and which is secured to the same shaft 205a as the Maltese cross device 53, is also selectively drivable from the toothed wheel 271 under the control of the clutch device 258 so that, when the plate 255 of the transfer mechanism 200 is disengaged from the driving toothed wheel 271, the disk 270 is in driving engagement therewith.

Resilient members 257 are interposed between the guide 254 and the translation arm 246 in order to avoid forming a system that is statically overdefined.

In general, the bearing 250 and the drive shaft 250a of the Maltese cross device 53 are disposed essentially perpendicularly to the translation arm 246 and to the plane containing the axis 23 of the furnace and the axis of rotation 22 of the carousel, whenever the number of cartridges on the carousel is a multiple of 4.

In FIGS. 3 and 5, the carousel 9 is shown in its rest position, with a cartridge-holder 20 being situated in the plane of the axes 22 and 23 and in engagement with the free end of the arm 246 that faces the furnace.

As can be seen in FIGS. 3 to 6 and 8, the translation arm 246 has projecting portions 275 capable of being received in grooves of complementary profile 276 formed in the cartridge-holders 20 whenever a cartridge-holder 20 is positioned to face the translation arm 246.

During a transfer phase (passing from the position of FIGS. 3 and 5 to the position of FIGS. 4 and 6), a cartridge-holder 20 is driven in translation by the moving arm 246, which is itself driven by the guide 254 that receives drive from the finger 262 that is secured to the plate 255.

The translation motion is guided by the arm 256.

FIGS. 4 and 6 show a cartridge 11 in the working position. The cartridge-holder 21 is pressed against the fixed support 17 which is secured to the mechanism 6 for moving the furnace in translation.

The furnace then moves from its loading position to its beginning-of-heating position 1' and then to its end-of-melting position 1".

To bring the cartridge 10 from a storage position to the working position 11, the plate 255 rotates substantially through half a turn, while the mechanism that controls rotation of the cartridge-holders remains stationary.

It may be observed that the final position of the cartridge 11 may be sensitive to possible rotation error of the plate.

FIGS. 5 and 6 show the carousel as seen from above, revealing the relationship between the mechanism 12 for controlling rotary drive of the cartridge-holders and the mechanism 200 for transferring a cartridge, which mechanisms are offset by 90° from each other, but have coaxial actuators driven from the single electric motor 50 under the control of a clutch device 258.

The clutch device 258 makes it possible to apply drive from the motor 50, the gear wheel 52 and the toothed wheel 270 alternately to the disk 250 and to the plate 255.

In FIG. 6, a cartridge 11 can be seen positioned on the axis of the furnace, the toothed wheel 271 and the plate 255 having performed half a turn, while the disk 270 has remained stationary.

Figure 7:
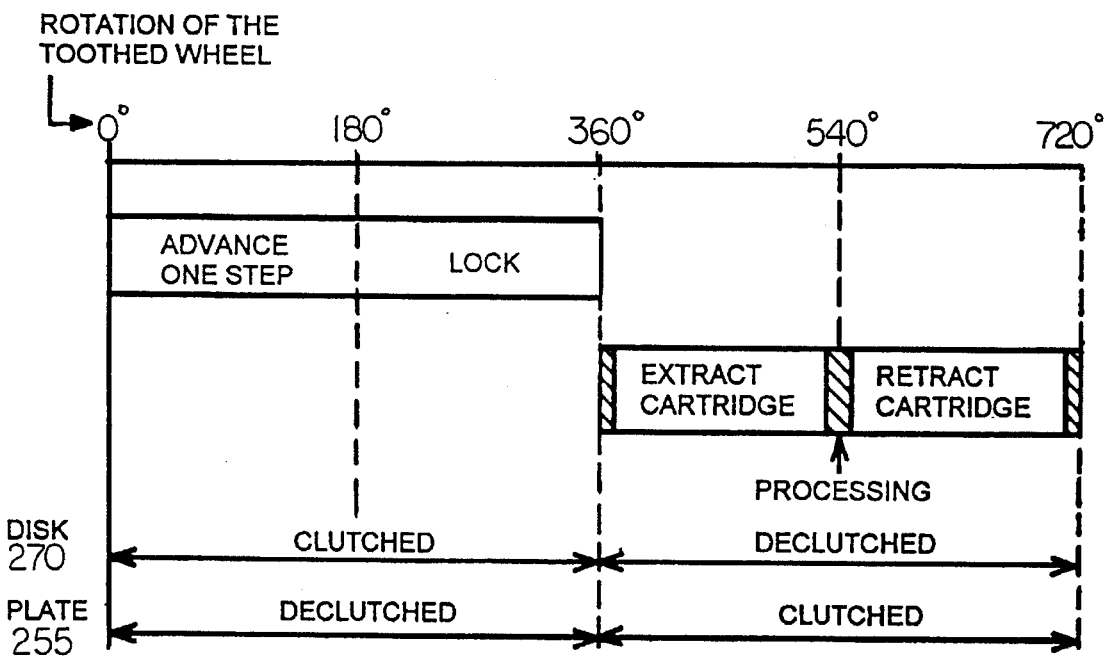
FIG. 7 is a diagram showing an operating cycle of the device shown in FIGS. 3 to 6.

FIG. 7 constitutes an operating diagram representing a complete extraction-retraction cycle of one cartridge as spread out over two revolutions of the toothed wheel 271.

The complete cycle occupies two revolutions of the toothed wheel 271 under drive from the electric motor 50, as follows: The first revolution corresponds to the carousel rotating through one step and to the cartridge-holders 20 being locked in place, the disk 270 which is secured to the shaft 250a having the Maltese cross device 53 attached thereto being clutched to the toothed drive wheel 271, while the plate 255 of the transfer mechanism is declutched from the driving toothed wheel 271. The second revolution corresponds to a cartridge 11 being extracted from the carousel 9, to the extracted cartridge 11 being processed in the furnace, and to the cartridge being put back into place in the carousel, the disk 270 secured to the shaft 250a having the Maltese cross device 53 connected thereto being declutched from the driving toothed wheel 271 while the plate 255 of the transfer mechanism is clutched to the driving toothed wheel 271.

The actuator 258 enabling the toothed wheel 271 to be clutched alternately to the plate 255 or to the disk 270 may be active and constituted by a bistable electromagnet, or it may be passive, as shown in FIGS. 10A, 10B and 10C.

The passive actuator 280 rotates in the toothed wheel 271, is provided with four flat faces disposed in two pairs of opposite faces, and is locked alternately in a recess 281 formed in the disk 270 and in a recess 281b formed in the plate 255. A wheel 282 in the form of a cross has four stable positions. Under drive from a finger 283, on each revolution of the toothed wheel 271, the cross-shaped wheel 282 is rotated through 90°, thereby giving rise to the above-mentioned alternate locking.

Figure 8:
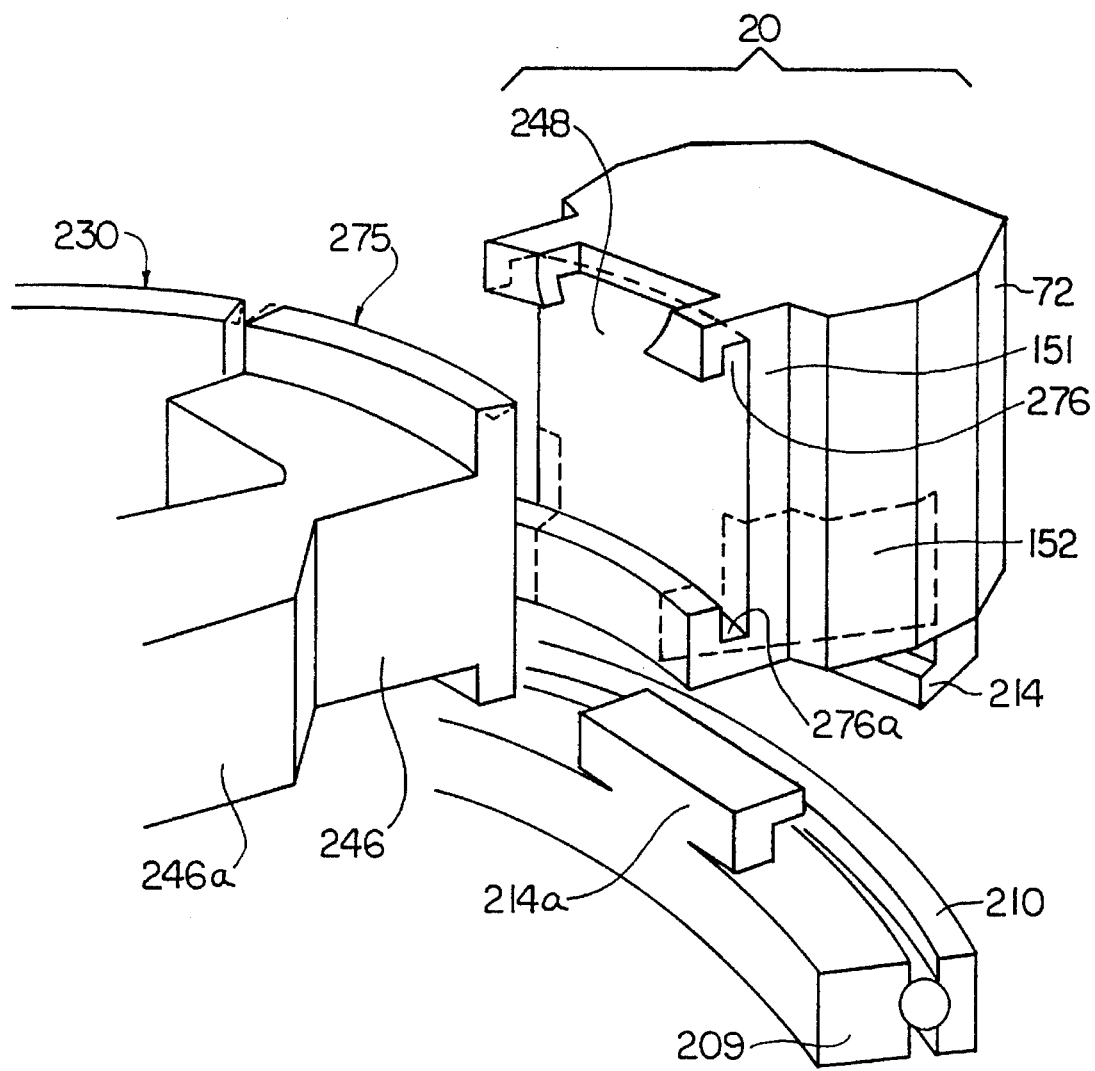
FIG. 8 is an exploded perspective view of a detail showing the connection between a transfer arm of a device of the invention and a cartridge-holder.

FIG. 8 shows the interface between the translation arm 246 and a cartridge-holder 20 in detail.

In this figure, the following can be seen on the cartridge-holder 20: the grooves 276 and 276a that receive the projecting portions 275 of the translation arm 246; the slot 151 complementary to the drive finger 247 of the Maltese cross; a face 72 for centering relative to the furnace mechanism; an optional recess 152 to leave room for passing an optional projection 246a on the arm 246; and an opening 248 making locking possible by means of the Maltese cross and a catch 214 for assembling the cartridge-holder 20 on a lug 214a secured to the base 209 of the carousel. A stationary ball-bearing ring integrated in the carousel is reference 210.

FIG. 8 also shows an optional stationary safety ring 230 which serves to prevent the cartridge-holders 20 disengaging from the lugs 214a in any position other than when situated in line with the arm 246.

Figure 14:
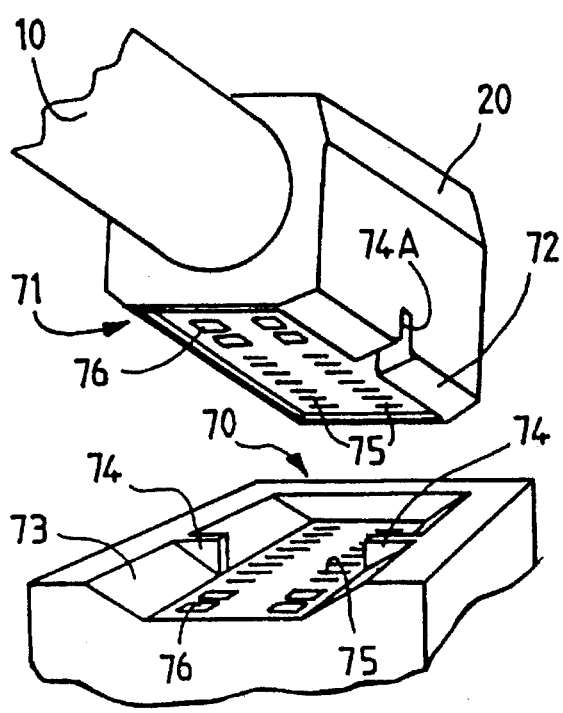
FIG. 14 is a perspective view of an electrical connector device applicable to a cartridge-exchange device of the invention.

FIG. 14 shows an example of a flat electrical connector 71 formed on a cartridge-holder 20 and co-operating with a connector 70 formed on the support 6 of the mechanism for moving the furnace in translation.

Each of the connectors 71 and 70 has respective complementary V-shaped lateral centering elements 72 and 73, at least one respective axial centering element 74 and 74A, low current electrical contacts 75, and higher current electrical contacts 76. The electrical connectors 70 and 71 are engaged with each other only when the cartridge-holder 20 is put into its working position. The contacts 75 and 76 may be constituted, for example, by metal-plated surfaces on a printed circuit for the connector 71, and by flexible eyelash-like wires for the connector 70.

FIG. 11 shows a second embodiment of a furnace loader device of the invention.

The embodiment of FIG. 11 is simpler in structure than the first embodiment, but it is unsuitable for allowing cartridges to be processed in random order, i.e. with the option of choosing any cartridge for processing from the carousel 1a.

The embodiment in FIG. 11 uses a mechanism in which one-fourth of a revolution of a first driving toothed wheel 271a suffices for a stage of extracting or retracting a cartridge relative to the carousel. This mechanism avoids any need to provide a clutch member 258.

In FIG. 11, the arms 256 and the translation arm 246 (mounted as a parallelogram linkage) are retained, as is the single electric motor 50 and its step-down outlet gear wheel 52.

In contrast, the plate 255, the disk 270 and the guide 254 of the embodiment of FIGS. 3 to 6 are omitted.

A second toothed wheel 271 directly drives the shaft 250a of the Maltese cross mechanism 53 which may have the same structure as that described above. The second toothed wheel 271 is itself driven by the driving first toothed wheel 271a which has the same number of teeth, and which is directly driven by the step-down outlet gear wheel 52 of the motor 50. The first toothed wheel 271a is provided with a finger 262 that acts on a cam 262a formed on a projection 256a on one of the arms 256.

In the embodiment of FIG. 11, because of the special shape of the cam 262a, one complete extraction-retraction cycle for a cartridge on the carousel and also for advancing the carousel rotation mechanism through one step is achieved on each complete revolution of the first driving toothed wheel 271a.

More particularly, during one complete revolution of the first driving toothed wheel 271a, during the first half-revolution, the parallelogram structure of the transfer mechanism 200 is kept stationary in the retracted position by means of the cam 262a having a semi-circular profile centered on the first driving toothed wheel 271a, while rotation of the first and second driving toothed wheels 271a and 271 causes the cartridge supports to rotate through one step, and during the second half-revolution, rotation of the second toothed wheel 271 locks the carousel 9 in the position it acquired in the preceding half-revolution, while rotation of the first toothed wheel 271a driving the finger 262 in an arcuate return portion of the cam 262a serves during the first half of the second half-revolution to advance the translation arm 246 so as to bring a cartridge 11 into the working position in the furnace, and during the second half of the second half-revolution, to retract the translation arm 246, thereby returning the processed cartridge 11 into the carousel 9.

Various modifications and additions can be applied to the embodiments described. Thus, the moving translation arm 246 may be fitted with a protective flap 227 which closes the window 25 of the hermetic container 24 containing the carousel 9 while a cartridge 11 placed in the furnace 1 is being processed (FIG. 12).

The protective flap 227 may provide protection simultaneously against heat radiation from the furnace and the cartridge, and against possible contamination due to a failure of the crucible and of the cartridge.

I claim:

1. A loader device for an automatic space furnace for processing purposes, the furnace having a longitudinal axis and means for driving the furnace in translation in guided manner along said longitudinal axis, the loader device being disposed in the vicinity of the furnace and comprising a cartridge-carrier carousel provided with a set of cartridge-holders in which sealed, closed cartridges are removably mounted, each cartridge being designed to contain a sample for processing in said space furnace, all of the cartridges being disposed in the carousel parallel to its axis of rotation, the loader device further comprising a control mechanism for imparting indexed rotary drive to the cartridge-holders, wherein the carousel is mounted to one side of the furnace in such a manner that its axis of rotation is parallel to the longitudinal axis of the furnace, wherein each cartridge-holder of the carousel cooperates with a transfer mechanism including a translation arm extending perpendicularly to the axis of rotation of the carousel to enable each cartridge to be brought successively into a working position in which the axis of the cartridge is in alignment with the longitudinal axis of the furnace, and wherein the control mechanism for imparting rotary drive to the cartridge-holders and to the transfer mechanism are activated alternately by a single electric motor.

2. A device according to claim 1, wherein the carousel and the control mechanisms for imparting rotary drive to the cartridge-holders and for transferring them are both placed inside a hermetic container provided with a closeable lateral opening.

3. A device according to claim 1, wherein the control mechanism for imparting rotary drive to the cartridge-holders comprises a shaft disposed perpendicularly to the translation arm, having one end disposed to receive rotary motion from an electric motor and having its other end disposed to drive a Maltese cross device acting on the cartridge-holders.

4. A device according to claim 3, wherein the Maltese cross mechanism comprises a finger for controlling rotation that acts on grooves formed in the cartridge-holders parallel to the axis of the carousel, and a cam co-operating with openings formed in the cartridge-holders to perform locking in each indexed position.

5. A device according to claim 1, wherein the transfer mechanism comprises at least two arms hinged firstly to a stand fixed to the bottom of the carousel and extending perpendicularly to said bottom, and secondly to the translation arm to co-operate with the translation arm to constitute a parallelogram linkage.

6. A device according to claim 5, wherein the transfer mechanism comprises a guide fixed to the translation arm and extending perpendicularly thereto, and a finger engaged in the guide and secured to a plate occupying a plane parallel to said stand and capable of being selectively driven, under the control of a clutch device, from a driving toothed wheel whose axis is perpendicular to the plane of the stand and which meshes with a step-down gear wheel disposed at the outlet from the electric motor.

7. A device according to claim 6, wherein the control mechanism for imparting rotary drive to the cartridge-holders comprises a shaft disposed perpendicularly to the translation arm, having one end disposed to receive rotary motion from an electric motor and having its other end disposed to drive a Maltese cross device acting on the cartridge-holders, and wherein the control mechanism for imparting rotary drive to the cartridge-holders comprises a disk extending in a plane parallel to the stand, which disk is secured to the shaft having the Maltese cross device attached thereto and is capable of being selectively driven under the control of the clutch device from the driving toothed wheel when the plate of the transfer mechanism is itself declutched relative to the driving wheel.

8. A device according to claim 6, wherein resilient elements are interposed between the guide and the translation arm.

9. A device according to claim 7, wherein, during two revolutions of the driving toothed wheel: the first revolution corresponds to the carousel rotating through one step and to the cartridge-holders being locked in place, while the disk which is secured to the shaft that is connected to the Maltese cross device is clutched to the driving toothed wheel, and while the plate of the transfer mechanism is declutched from the driving toothed wheel; and the second revolution corresponds to a step of extracting a cartridge from the carousel, of processing the extracted cartridge in the furnace, and of returning the cartridge, while the disk which is secured to the shaft having the Maltese cross device secured thereto is declutched from the driving toothed wheel, and while the plate of the transfer mechanism is clutched to the driving toothed wheel.

10. A device according to claim 5, wherein the transfer mechanism comprises a cam secured to one of the arms, and a finger which acts on the cam and is secured to a first driving toothed wheel whose axis is perpendicular to the plane of the stand, and which meshes with a step-down gear wheel disposed at the outlet from the electric motor.

11. A device according to claim 10, wherein the control mechanism for imparting rotary drive to the cartridge-holders comprises a shaft disposed perpendicularly to the translation arm, having one end disposed to receive rotary motion from an electric motor and having its other end disposed to drive a Maltese cross device acting on the cartridge-holders, and wherein the control mechanism for imparting rotary drive to the cartridge-holders includes a second driving toothed wheel whose axis is perpendicular to the plane of the stand, which has the same number of teeth as the first driving toothed wheel, and which meshes therewith, the second driving toothed wheel being secured to the shaft which has the Maltese cross device attached thereto.

12. A device according to claim 11, wherein, during one revolution of the first driving toothed wheel, during the first half-revolution, the parallelogram linkage of the transfer mechanism is held stationary in its retracted position by the cam having a semi-circular profile centered on the first drive wheel, while rotation of the first and second driving toothed wheels causes the cartridge-holders to rotate through one step, and during the second half-revolution, rotation of the second driving toothed wheel locks the carousel in the position it has previously acquired, while rotation of the first driving toothed wheel drives the finger along an arcuate return portion of the cam such that during a first half of the second half-revolution, the translation arm advances to bring a cartridge into the working position in the furnace, and during the second half of the second half-revolution, the translation arm retracts, thereby returning the processed cartridge to the carousel.

13. A device according to claim 1, wherein the translation arm has projecting portions capable of being received in grooves of complementary profile formed in the cartridge-holders, whenever a cartridge-holder is positioned facing the translation arm.

14. A device according to claim 6, wherein the clutch device is of the active type and comprises an electromagnet.

15. A device according to claim 7, wherein the clutch device is of the passive type and comprises an actuator element provided with two pairs of opposite plane faces, which actuator device revolves in the driving toothed wheel and co-operates with a cross-shaped wheel which posses four stable positions and which, on each revolution of the driving toothed wheel, is rotated through 90° by means of a finger, thereby locking the actuator element, either in a recess formed in the disk, or else in a recess formed in the plate.

16. A device according to claim 1, wherein each cartridge-holder comprises an essentially plane interface for mechanical positioning and for electrical connection adapted to co-operate with a single, essentially plane complementary interface for mechanical positioning and for electrical connection disposed on means for supporting the means that drive the furnace in translation.

17. A device according to claim 1, wherein it is applied to a furnace subdivided into first and second blocks that are independently mounted via respective connection elements on a furnace support having an axis parallel to the axis of the furnace in its working position, the second furnace block that is further away from the holder for the cartridge being processed being mounted in such a manner as to be capable of pivoting about the axis when said block is in a position where it no longer contains the cartridge while the first furnace block, closer to the holder for the cartridge being processed is mounted so as to be capable of continuing its own displacement along the axis of the furnace after the second furnace block has been retracted by pivoting so as to take up a position adjacent said retracted second furnace block.

* * * * *

UNITED STATES PATENT AND TRADEMARK OFFICE
CERTIFICATE OF CORRECTION

PATENT NO. : 5,549,473
DATED : August 27, 1996
INVENTOR(S) : Dominique Valentian It is certified that error appears in the above-indentified patent and that said Letters Patent is hereby corrected as shown below:

Title page, Item [73], in the Assignee's address, "Suresmes, France" should read --Suresnes, France--.

Column 1, line 22, "scaled" should read --sealed--.

Column 2, line 61, "cartridge-carder" should read --cartridge-carrier--.

Column 5, line 19, "FIGS. 3 and 4" should read --FIGS. 3A, 3B and FIG. 4--.

Column 5, line 25, "shown in FIGS. 3 to 6" should read --shown in FIGS. 3A to 6--.

Column 5, line 31, "3 to 6" should read --3A to 6--.

Column 5, line 35, "3 to 6" should read --3A to 6--.

Column 5, line 36, "FIG. 11 is" should read --FIGS. 11A and 11B are--.

Column 10, line 10, "FIGS. 3 to 10." should read --FIGS. 3A to 10--.

Column 10, line 23, "FIGS. 3, 4 and 9" should read --FIGS. 3A, 3B, 4 and 9--.

Column 10, line 47, "FIGS. 3 to 6" should read --FIGS. 3A to 6--.

UNITED STATES PATENT AND TRADEMARK OFFICE
CERTIFICATE OF CORRECTION

PATENT NO. : 5,549,473                                   Page 2 of 3
DATED      : August 27, 1996
INVENTOR(S): Dominique Valentian It is certified that error appears in the above-indentified patent and that said Letters Patent is hereby corrected as shown below:

Column 11, line 6, "FIGS. 3 and 5" should read --FIGS. 3A, 3B and 5--.

Column 11, line 10, "FIGS. 3 to 6 and 8" should read --FIGS. 3A to 6 and 8--.

Column 11, line 16, "FIGS. 3 and 5" should read --FIGS. 3A, 3B and 5--.

Column 12, line 26, "ball-beating" should read --ball-bearing--.

Column 12, line 45, "FIG. 11" should read --FIGS. 11A and 11B--.

Column 12, line 47, "FIG. 11 is" should read --FIGS. 11A and 11B are--.

Column 12, line 52, "FIG. 11 uses" should read --FIGS. 11A and 11B use--.

UNITED STATES PATENT AND TRADEMARK OFFICE
CERTIFICATE OF CORRECTION

PATENT NO. : 5,549,473
DATED : August 27, 1996
INVENTOR(S) : Dominique Valentian It is certified that error appears in the above-indentified patent and that said Letters Patent is hereby corrected as shown below:

```
    Column 12, line 57, "In FIG. 11," should read
--In FIGS. 11A and 11B,--.

Column 13, line 5, "FIG. 11" should read --FIGS. 11A and
11B--.
```

Signed and Sealed this

Twenty-sixth Day of August, 1997

BRUCE LEHMAN

*Attest:*

*Attesting Officer*     Commissioner of Patents and Trademarks